(12) United States Patent
McAdow et al.

(10) Patent No.: US 11,480,698 B2
(45) Date of Patent: *Oct. 25, 2022

(54) FLUID SATURATION MODEL FOR PETROPHYSICAL INVERSION

(71) Applicant: ExxonMobil Upstream Research Company, Spring, TX (US)

(72) Inventors: David D. McAdow, The Woodlands, TX (US); Jan Schmedes, Bellaire, TX (US); Ratnanabha Sain, Houston, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 327 days.

This patent is subject to a terminal disclaimer.

(21) Appl. No.: 16/514,716

(22) Filed: Jul. 17, 2019

(65) Prior Publication Data

US 2020/0040709 A1 Feb. 6, 2020

Related U.S. Application Data

(60) Provisional application No. 62/871,479, filed on Jul. 8, 2019, provisional application No. 62/712,780, filed on Jul. 31, 2018.

(51) Int. Cl.
*G01V 1/28* (2006.01)
*E21B 41/00* (2006.01)
(Continued)

(52) U.S. Cl.
CPC .......... *G01V 1/282* (2013.01); *E21B 41/0092* (2013.01); *E21B 49/00* (2013.01);
(Continued)

(58) Field of Classification Search
CPC ...... G01V 1/282; G01V 99/005; G01V 1/306; G01V 2210/6244; G01V 2210/645; E21B 49/00
See application file for complete search history.

(56) References Cited

U.S. PATENT DOCUMENTS 5,848,379 A 12/1998 Bishop
7,184,367 B2 2/2007 Yin
(Continued)

FOREIGN PATENT DOCUMENTS

CN 105487122 A * 4/2016

OTHER PUBLICATIONS

Ross, Christopher P. "Effective AVO crossplot modeling: A tutorial." Geophysics 65, No. 3 (Society of Exploration Geophysicists, 2000): pp. 700-711. DOI: 10.1190/1.1444769 (Year: 2000).*

(Continued)

*Primary Examiner* — Rehana Perveen
*Assistant Examiner* — Daniel E Miller
(74) *Attorney, Agent, or Firm* — ExxonMobil Upstream Research Company—Law Department

(57) ABSTRACT

A method and apparatus for generating a fluid saturation model for a subsurface region. One example method generally includes obtaining a model of the subsurface region; for each of a plurality of fluid types: flooding the subsurface region model with the fluid type to generate a flood model; and running a trial petrophysical inversion with the flood model to generate a trial petrophysical model; identifying potential fluid contact regions in the trial petrophysical models; partitioning the subsurface region model at the identified potential fluid contact regions; and constructing the fluid saturation model from the partitioned subsurface region model.

20 Claims, 8 Drawing Sheets

(51) Int. Cl.
| | |
|---|---|
| *E21B 49/00* | (2006.01) |
| *G01V 99/00* | (2009.01) |
| *G06N 20/00* | (2019.01) |
| *G01V 1/30* | (2006.01) |

(52) U.S. Cl.
CPC ............ *G01V 99/005* (2013.01); *G01V 1/306* (2013.01); *G01V 2210/6244* (2013.01); *G01V 2210/645* (2013.01); *G06N 20/00* (2019.01)

(56) References Cited

U.S. PATENT DOCUMENTS

| | | | | |
|---|---|---|---|---|
| 7,526,413 | B2 | 4/2009 | Dahlberg | |
| 7,676,349 | B2 | 3/2010 | Xu et al. | |
| 8,447,524 | B2* | 5/2013 | Chen | G01V 1/302 702/14 |
| 8,498,853 | B2 | 7/2013 | Crawford et al. | |
| 8,923,094 | B2 | 12/2014 | Jing et al. | |
| 9,453,929 | B2 | 9/2016 | Schmedes et al. | |
| 9,494,711 | B2 | 11/2016 | Leahy et al. | |
| 9,702,995 | B2 | 7/2017 | DiCaprio et al. | |
| 9,703,006 | B2 | 7/2017 | Stern et al. | |
| 2006/0155475 | A1 | 7/2006 | Yin | |
| 2011/0208431 | A1* | 8/2011 | Skelt | G01V 99/00 702/7 |
| 2012/0158378 | A1* | 6/2012 | Enchery | G01V 11/00 703/2 |
| 2012/0234554 | A1 | 9/2012 | Kumaran | |
| 2013/0013209 | A1* | 1/2013 | Zhu | G01N 33/24 702/6 |
| 2015/0301223 | A1 | 10/2015 | Xu et al. | |
| 2015/0362623 | A1* | 12/2015 | Miotti | G01V 11/00 702/14 |
| 2017/0212275 | A1 | 7/2017 | Skelt | |
| 2017/0335675 | A1 | 11/2017 | Lee et al. | |
| 2018/0156932 | A1 | 6/2018 | Sain | |
| 2019/0064389 | A1 | 2/2019 | Denli et al. | |

OTHER PUBLICATIONS

Lock Williams, Susan. "Why prestack depth migration is worth its salt." Offshore (Conroe, Tex.) (Endeavor Business Media, LLC., 2006) vol. 66, No. 6. [Retrieved online] <https://www.offshore-mag.com/geosciences/article/16754347/why-prestack-depth-migration-is-worth-its-salt>. (Year: 2006).*

Li, Jing-Ye. "Gas reservoir identification by seismic AVO attributes on fluid substitution." Applied Geophysics 9, No. 2 (2012) pp. 139-148. DOI: 10.1007/s11770-012-0323-7 (Year: 2012).*

Murphy, William, Andrew Reischer, and Kai Hsu. "Modulus decomposition of compressional and shear velocities in sand bodies." (Society of Exploration Geophysicists, 1993) Geophysics 58, No. 2 : 227-239. DOI: 10.1190/1.1443408 (Year: 1993).*

Teixeira, Raquel Goncalves, Igor Santana Lopes Braga, and Luiz Geraldo Lucchesi Loures. "Bayesian characterization of subsurface lithofacies and saturation fluid." (OnePetro, 2007) In Latin American & Caribbean Petroleum Engineering Conference, SPE 108027. pp 1-12. (Year: 2007).*

Bosch, Miguel, Tapan Mukerji, and Ezequiel F. Gonzalez. "Seismic inversion for reservoir properties combining statistical rock physics and geostatistics: A review." (Society of Exploration Geophysicists, 2010) Geophysics 75, No. 5: 75A165-75A176. https://doi.org/10.1190/1.3478209 (Year: 2010).*

Kolbjornsen, Odd, et. al. "Bayesian AVO inversion to rock properties using a local neighborhood in a spatial prior model." (Society of Exploration Geophysicists, 2016) The Leading Edge 35, No. 5: 431-436. https://doi.org/10.1190/tle35050431.1 (Year: 2016).*

Dario Grana, et al. (May 2010), "Probabilistic petrophysical-properties estimation integrating statistical rock physics with seismic inversion", Geophysics, Society of Exploration Geophysicists, US, vol. 75, No. 3, May 1, 2010 (May 1, 2010), pp. 021-037.

Thierry Coleou et al. (Jan. 2005) "Petrophysical Seismic Inversion" SEG Technical Program expanded Abstracts 2005, Jan. 1, 2005 (Jan. 1, 2005), pp. 1355-1358, cols. 1-3; figure 1.

Dhananjay Kumar (Jan. 2006), "A Tutorial on Gassmann Fluid Substitution: Formulation, Algorithm and Matlab Code", Geohorizons, Jan. 31, 2006 (Jan. 31, 2006) pp. 4-12. Retrieved from the internet: http://spaindia.org/geohorizon/jan_2006/dhananjay_paper.pdf retrieved Oct. 20, 2017 Chapters Introduction, Algorithm, Example.

Cgg Geosoftware: (May 2016), "Jason-Advanced Seismic Reservoir Characterization Software", May 18, 2016 (May 18, 2016), pp. 1-4 Retrieved from the internet: http://www.cgg.com/data/1/rec_docs/3292_Jason_Overview_BR_1605.pdf retrieved Oct. 29, 2019, pp. 2-3.

Khoury et al. (2018) "Quantitative interpretation using facies-based inversion applied to the Ordovician Red River U4 dolomite interval, Williston Basin", Department of Geophysics, Colorado School of Mines, Ikon Science, SEG International Exposition and 88th Annual Meeting; pp. 3262-3266.

Waters et al. (2018) "Multi-scenario, multi-realization seismic inversion for probabilistic seismic reservoir characterization", Ikon Science Ltd., SEG International Exposition and 88th Annual Meeting, pp. 3146-3149.

Aleardi et al. (2018) "Two-stage and single stage seismic petrophysical inversion applied in the Nile Delta", The Leading Edge, vol. 37, Issue 7 (Jul. 2018), pp. 510-518.

Gao et al. (2012) "Joint petrophysical inversion of electromagnetic and full-waveform seismic data", Geophysics, vol. 77, Issue 3, pp. WA3-WA18.

Lock-Williams, S. (2006) "Why prestack depth migration is worth its salt," Offshore Magazine, vol. 6, Issue 6 (Jun. 1, 2006), available at https://www.offshore-mag.com/articles/print/volume-66/issue-6/geology-geophysics/why-prestack-depth-migration-is-worth-its-salt.html.

Zhang et al. (2018) "Multiparameter elastic full waveform inversion with facies-based constraints", Geophysical Journal International, vol. 213, Issue 3, pp. 2112-2127.

\* cited by examiner

FLUID SATURATION MODEL FOR PETROPHYSICAL INVERSION

CROSS-REFERENCE TO RELATED APPLICATIONS

This application claims the benefit of U.S. Provisional Application 62/712,780, filed Jul. 31, 2018 and entitled FLUID SATURATION MODEL FOR PETROPHYSICAL INVERSION, and U.S. Provisional Application 62/871,479, filed Jul. 8, 2019 and entitled DETECTING FLUID TYPES USING PETROPHYSICAL INVERSION, the entirety of each of which are incorporated by reference herein.

FIELD

This disclosure relates generally to the field of geophysical prospecting and, more particularly, hydrocarbon management and related data processing. Specifically, exemplary embodiments relate to methods for improving computational efficiency and accuracy of petrophysical inversion techniques.

BACKGROUND

This section is intended to introduce various aspects of the art, which may be associated with exemplary embodiments of the present disclosure. This discussion is believed to assist in providing a framework to facilitate a better understanding of particular aspects of the present disclosure. Accordingly, it should be understood that this section should be read in this light, and not necessarily as admissions of prior art.

An important goal of geophysical prospecting is to accurately image subsurface structures to assist in the identification and/or characterization of hydrocarbon-bearing formations. Geophysical prospecting may employ a variety of data-acquisition techniques, including seismic prospecting, electromagnetic prospecting, well logging, etc. Such data may be processed, analyzed, and/or examined with a goal of identifying geological structures that may contain hydrocarbons.

An important type of geophysical data analysis is petrophysical inversion. Petrophysical inversion generally transforms elastic parameters, such as seismic velocity and density, to petrophysical parameters, such as porosity and volume of clay ($V_{clay}$). For example, petrophysical inversion can transform compressional velocity, shear velocity, and density well logs to porosity and $V_{clay}$ logs. As another example, petrophysical inversion can utilize elastic information from seismic data, including traditional images of reflectivity and tomographic velocity, to predict three-dimensional volumes of porosity and $V_{clay}$. As used herein, $V_{clay}$ refers to rock volumes including anything that is not sand (e.g., shale). In the current discussion, $V_{shale}$ (as used by other authors) may be substituted for $V_{clay}$. Furthermore, petrophysical inversion can include additional geophysical data types, namely electromagnetic data or resistivity, which tend to have a better sensitivity to water saturation than elastic parameters.

Petrophysical inversion utilizes a model of fluid saturation that recognizes the vertical and lateral distribution of hydrocarbons and water in a reservoir. For example, in the case of well logs, a one-dimensional fluid saturation model may be derived with analysis of traditional electric well logs using the Archie equation. Building a two-dimensional or three-dimensional fluid saturation model for petrophysical inversion is a significant technical challenge that involves analysis and interpretation of seismic data to laterally-bind reservoir extent and known or suspected fluid contact surfaces. The depth of hydrocarbon contact surfaces can be detected by log analysis if penetrated by a well or hypothesized from extrapolation of pressure trends. The challenge remains what to do when contacts are not penetrated by a well and what to do away from the well when the time-to-depth relationship is uncertain and the potential for variable hydrocarbon contacts increases with complex geology (e.g. separated fault blocks or stratigraphic barriers to flow).

More efficient and accurate equipment and techniques to generate fluid saturation models for petrophysical inversion would be beneficial. More specifically, a data-driven solution that provides consistency between the seismic data amplitudes and petrophysical and rock physics models would represent a significant improvement over current practices.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

DETAILED DESCRIPTION

Figure 1:
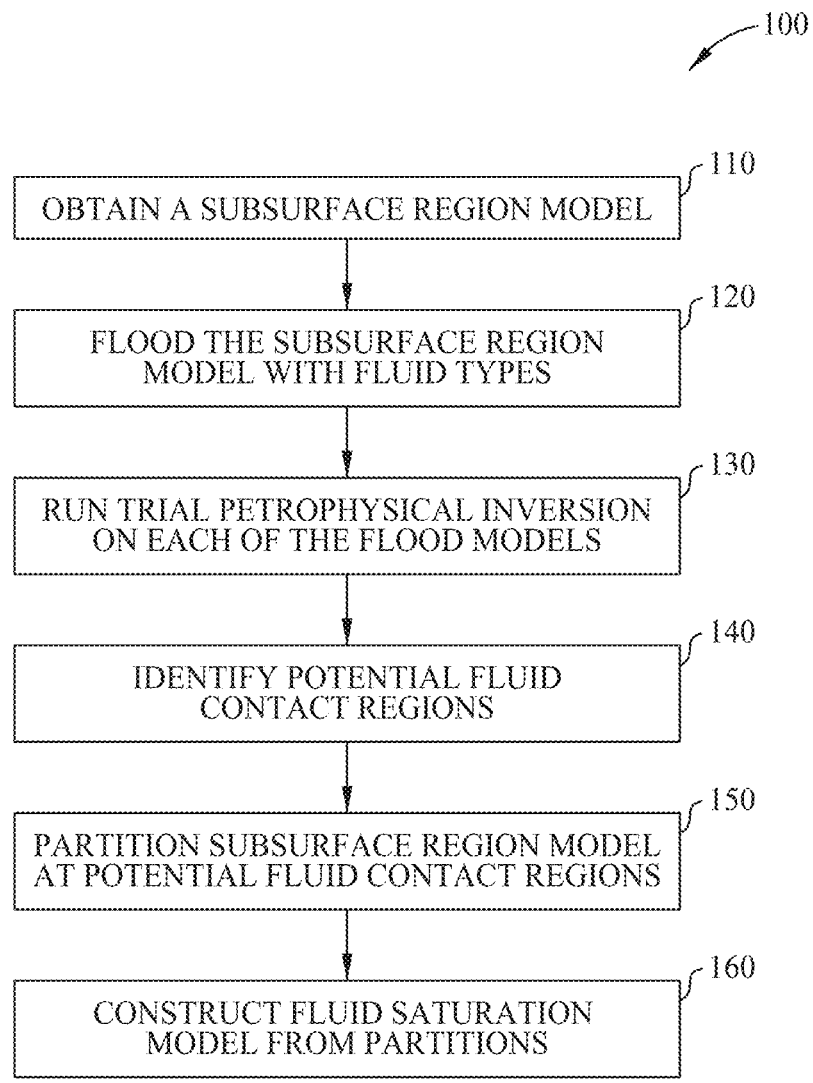
FIG. 1 illustrates an exemplary workflow for constructing a fluid saturation model for petrophysical inversion.

It is to be understood that the present disclosure is not limited to particular devices or methods, which may, of course, vary. It is also to be understood that the terminology used herein is for the purpose of describing particular embodiments only, and is not intended to be limiting. As used herein, the singular forms "a," "an," and "the" include singular and plural referents unless the content clearly dictates otherwise. Furthermore, the words "can" and "may" are used throughout this application in a permissive sense (i.e., having the potential to, being able to), not in a mandatory sense (i.e., must). The term "include," and derivations thereof, mean "including, but not limited to." The term "coupled" means directly or indirectly connected. The word "exemplary" is used herein to mean "serving as an example, instance, or illustration." Any aspect described herein as "exemplary" is not necessarily to be construed as preferred or advantageous over other aspects. The term "uniform" means substantially equal for each sub-element, within about ±10% variation. The term "nominal" means as planned or designed in the absence of variables such as wind, waves, currents, or other unplanned phenomena. "Nominal" may be implied as commonly used in the fields of geophysical prospecting and/or hydrocarbon management.

As used herein, a fluid is a substance that deforms or flows under an applied shear stress, including phases of matter such as liquids and gases. Specifically relevant to hydrocarbon prospecting, the term "fluid" includes oil, water, and natural gas (or simply "gas").

The terms "volume model" or "physical property model" or similar terms, as used herein, refer to an array of numbers, typically a 3-D array, wherein each number, which may be called a model parameter, is a value of velocity, density, porosity, or another physical property in a cell, wherein a subsurface region has been conceptually divided into discrete cells for computational purposes.

As used herein, "hydrocarbon management" or "managing hydrocarbons" includes any one or more of the following: hydrocarbon extraction; hydrocarbon production (e.g., drilling a well and prospecting for, and/or producing, hydrocarbons using the well; and/or, causing a well to be drilled to prospect for hydrocarbons); hydrocarbon exploration; identifying potential hydrocarbon-bearing formations; characterizing hydrocarbon-bearing formations; identifying well locations; determining well injection rates; determining well extraction rates; identifying reservoir connectivity; acquiring, disposing of, and/or abandoning hydrocarbon resources; reviewing prior hydrocarbon management decisions; and any other hydrocarbon-related acts or activities. The aforementioned specifically include not only the acts themselves (e.g., extraction, production, drilling a well, etc.), but also or instead the direction and/or causation of such acts (e.g., causing hydrocarbons to be extracted, causing hydrocarbons to be produced, causing a well to be drilled, causing the prospecting of hydrocarbons, etc.).

As used herein, "obtaining" data or models generally refers to any method or combination of methods of acquiring, collecting, or accessing data or models, including, for example, directly measuring or sensing a physical property, receiving transmitted data or models, selecting data or models from a group of physical sensors, identifying data in a data record, and retrieving data or models from one or more libraries.

If there is any conflict in the usages of a word or term in this specification and one or more patents or other documents that may be incorporated herein by reference, the definitions that are consistent with this specification should be adopted for the purposes of understanding this disclosure.

Embodiments of the present disclosure relate to techniques for building accurate fluid models for use in petrophysical inversion. As would be understood by one of ordinary skill in the art with the benefit of this disclosure, a variety of petrophysical inversion techniques may be applicable herein. Exemplary petrophysical inversion techniques include i) two-stage petrophysical inversion (Aleardi, Mattia, Ciabarri, Fabio, Calabro, Roberto, 2018, "Two-stage and single stage seismic petrophysical inversion applied in the Nile Delta", The Leading Edge, Vol. 37, Issue 7 (July 2018), 510-518), ii) one-stage petrophysical inversion (Aleardi et al., 2018; US20180156932A1), iii) petrophysically-constrained Full Wavefield Inversion (FWI) (Zhang, Zhendong, Alkhalifah, Tariq, Naeini, Ehsan Zabihi, Sun, Bingbing, 2018, "Multiparameter elastic full waveform inversion with facies-based constraints," Geophysical Journal International, Vol 213, Issue 3, 2112-2127), and iv) joint inversion (Gao, Guozhong, Abubakar, Aria, Habashy, Tarek M, 2012, "Joint petrophysical inversion of electromagnetic and full-waveform seismic data", Geophysics, Vol 77, Issue 3, WA3-WA18). For example, joint inversion may include any of the other petrophysical inversion techniques wherein seismic data is used jointly with other geophysical data, such as gravity, magnetics, and/or electromagnetic geophysical data. Applicable types of petrophysical inversion utilize a spatial depiction, or model, of fluid saturation that allow transformation from elastic to petrophysical parameters. Typically, a two-stage petrophysical inversion solves for elastic parameters in a first stage, and then a second stage utilizes the fluid saturation model to transform from elastic to petrophysical parameters. Typically, a one-stage petrophysical inversion utilizes the fluid model as an integral component that allows the method to solve directly for petrophysical parameters from seismic data. While petrophysical inversion is historically thought of as a post-stack reservoir characterization method, recent advances in FWI also provide techniques applicable to the current disclosure. For example, in a variant of the two-stage inversion approach, FWI may produce the elastic parameters (for example, p-wave velocity $V_p$, the ratio of p-wave velocity to s-wave velocity $V_p/V_s$, and/or p-wave impedance $I_p$). As another example, petrophysically-constrained FWI may be analogous to a one-stage petrophysical inversion, but the forward modeling engine is FWI, and application of petrophysical constraints (e.g., to a fluid model) is performed inside the FWI iteration loop. Petrophysical inversion techniques are applicable to solve a variety of technical problems. Petrophysical inversion techniques may utilize a broad range of computational complexity and/or a multi-dimensional fluid saturation model.

One of the many potential advantages of the embodiments of the present disclosure is that accurate fluid saturation models for petrophysical inversion may be constructed more efficiently. Conventionally, constructing a fluid saturation model begins with inverting seismic data to create an elastic trace, and then running a second inversion with a reservoir fluid model to identify petrophysical parameters. The reservoir fluid model may be complex, reflecting fluid compositions and/or concentrations that vary in three-dimensions. Input to the reservoir fluid model may require extensive probing (e.g., wellbore logs and/or pressure measurements) of the subsurface formation. As noted in the Background section above, where such data is unavailable (e.g., due to lack of a penetrating well and/or when analyzing portions of a subterranean region away from a well), building an accurate two- or three-dimensional fluid saturation model may be difficult.

Conventional techniques to address the challenge of building a fluid saturation model rely upon making assumptions in extrapolating known or measured properties (e.g., at locations in the subterranean region where a penetrating well is present) to a remote subterranean region where no such direct measurements and/or samples are available. One example is time-to-depth conversion. The time-to-depth relationship calibrated at sparse wells is used along with time horizons (e.g., interpreted and mapped from seismic data) and fluid contacts identified in wells to generate a fluid model. The fluid model may be inaccurate in this approach because the time-to-depth conversion is inaccurate and/or the fluid contact assumed from wells is inappropriate at offset locations. The presently described methods, on the other hand, employ petrophysical inversion techniques to build a fluid model in a manner that does not rely upon a time-to-depth assumption or fluid contact(s) assumption from offset wells. As such, the presently described methods provide a more accurate and more efficient way to arrive at a fluid model, which may be used, e.g., to inform decisions on where to cause a well to be drilled for purposes of prospecting for hydrocarbons.

More particularly, the present disclosure includes a method that utilizes a novel variant of "velocity flooding" to solve the problems associated with accurate and efficient modeling of a subterranean region remote from a wellbore or other location with obtainable samples. Velocity flooding is a generally known workflow that geophysicists have conventionally employed in developing velocity models for Pre-Stack Depth Migration ("Pre-SDM") in salt basins such as the Gulf of Mexico, by building a complex 3D model through a series of iterations assuming simple velocity structure, trial migration, and interpretation of the trial migration (Lock-Williams, Susan, 2006, "Why prestack depth migration is worth its salt," Offshore Magazine, Vol. 6, Issue 6 (Jun. 1, 2006), available at www.offshore-mag.com). In particular, such velocity flooding may include filling all, or large portions, of the velocity model with constant or linearly increasing gradient velocity. The first iteration would fill the model with water velocity, the second would have a simple velocity gradient profile for sediments below the interpreted water bottom, the third would have a constant velocity of salt below the interpreted top salt, etc. The complexity of the model generally grows with each subsequent iteration.

The present disclosure recognizes that it is possible to adapt the underlying concepts of this velocity flooding workflow to the distinct problem of building a fluid saturation model. Instead of starting with "floods" of simple velocity profiles, methods of various embodiments disclosed herein employ simulating the filling of all (substantially all, or the vast majority thereof) available pore space of a fluid saturation model of a subterranean region with a given fluid type—even recognizing that this is not a realistic representation of the subterranean region. This "flooding" process is repeated iteratively with one or more different fluid types, as explained in more detail below.

As used herein, "flooding" a subsurface region model is defined as filling all, or substantially all, or the vast majority, of available pore space in the subsurface region model with gas, oil, or water. For example, the subsurface region model may be utilized to create a water-flood model, an oil-flood model, and a gas-flood model. Each of the flood models is deemed to be fully saturated with the respective fluid type. In some embodiments, volume of clay may be utilized to determine the available pore space for the flooding. For example, for an oil-flood model or a gas-flood model, the fraction of oil or gas in each cell may be less than 100%, dependent on the volume of clay of that cell. In other words, volume of clay may determine a fraction of pore space that is unavailable to oil or gas. Generally, the unavailable pore space (due to volume of clay) is saturated with water, so available pore space in a water flood model may be independent of volume of clay.

Flooding a subsurface region model with each of a plurality of fluid types, according to some embodiments described herein, provides a unique and novel solution to the problem of building an accurate and efficient fluid saturation model. Embodiments described herein may also provide many other advantages. For instance, embodiments disclosed herein may avoid the use of a reservoir fluid model, and likewise for a second seismic inversion to identify petrophysical parameters. Moreover, embodiments disclosed herein may provide fluid saturation models that are not limited by mapped horizon depth. Conventional models may be compared with those disclosed herein as a quality check. Embodiments disclosed herein may assist in evaluating uncertainty of depth conversions beyond what is available from seismic data. Another potential advantage includes improved characterization of hydrocarbons in a reservoir, including improvements in reserve estimations. Embodiments of the present disclosure can thereby be useful in the discovery, management, and/or extraction of hydrocarbons from subsurface formations.

Fluid saturation generally expresses the amount of water, oil, and gas in the pores of a rock, typically stated as a percentage of volume (e.g., pore space). Due to the influence of gravity, a subsurface formation is typically vertically segregated into regions dominated by water (lower), regions dominated by oil (mid-level), and regions dominated by gas (higher). A region of oil-water contact ("OWC") will typically lie between the water-dominated region and the oil-dominated region. Likewise, a region of gas-oil contact ("GOC") will typically lie between the oil-dominated region and the gas-dominated region. Many subsurface formations will exhibit only two of the three fluid types. At times, in addition to, or in lieu of, an OWC region and/or a GOC region, there may be a region of a gas-water contact ("GWC"). The fluid contact regions (OWC, GOC, GWC) typically will be relatively narrow and/or abrupt in the vertical direction (e.g., usually less than about 3 m for porous rock, such as clean sand, but may be as much as about 10 to about 15 m for shale-type sands with long transition zones), and relatively flat in the horizontal direction. In many instances, the discontinuity of the fluid contact region will be seismically detectable by imaging above and below the discontinuity.

Fluid saturation tends to cause changes to many of the elastic properties of a subsurface formation. For example, a pressure wave may be expected to have a lower velocity in an oil-filled reservoir compared to a non-saturated reservoir. On the other hand, fluid saturation does not change petrophysical rock properties, such as porosity or volume of clay ($V_{clay}$). Therefore, across a fluid contact region, elastic property data is expected to transition steeply and/or discontinuously (as the fluid saturation changes), while rock property data is expected to minimally transition and/or remain constant (across continuous geology). Application of this principle may improve construction and utilization of fluid saturation models for petrophysical inversion.

Conventionally, a three-dimensional fluid saturation model is derived from knowledge of horizons (e.g., mapped seismic reflectors) and direct knowledge (or an educated guess) of the location of the fluid contact regions from well information. The three-dimensional fluid saturation model may then be used in petrophysical inversion to estimate petrophysical properties (e.g., density, permeability, porosity, resistivity, $V_{clay}$, water saturation ($S_w$), reservoir geometry) from elastic parameters. However, petrophysical properties predicted from inversion will be in error if/when an incorrect fluid type is assumed in the fluid saturation model.

Figure 2A:
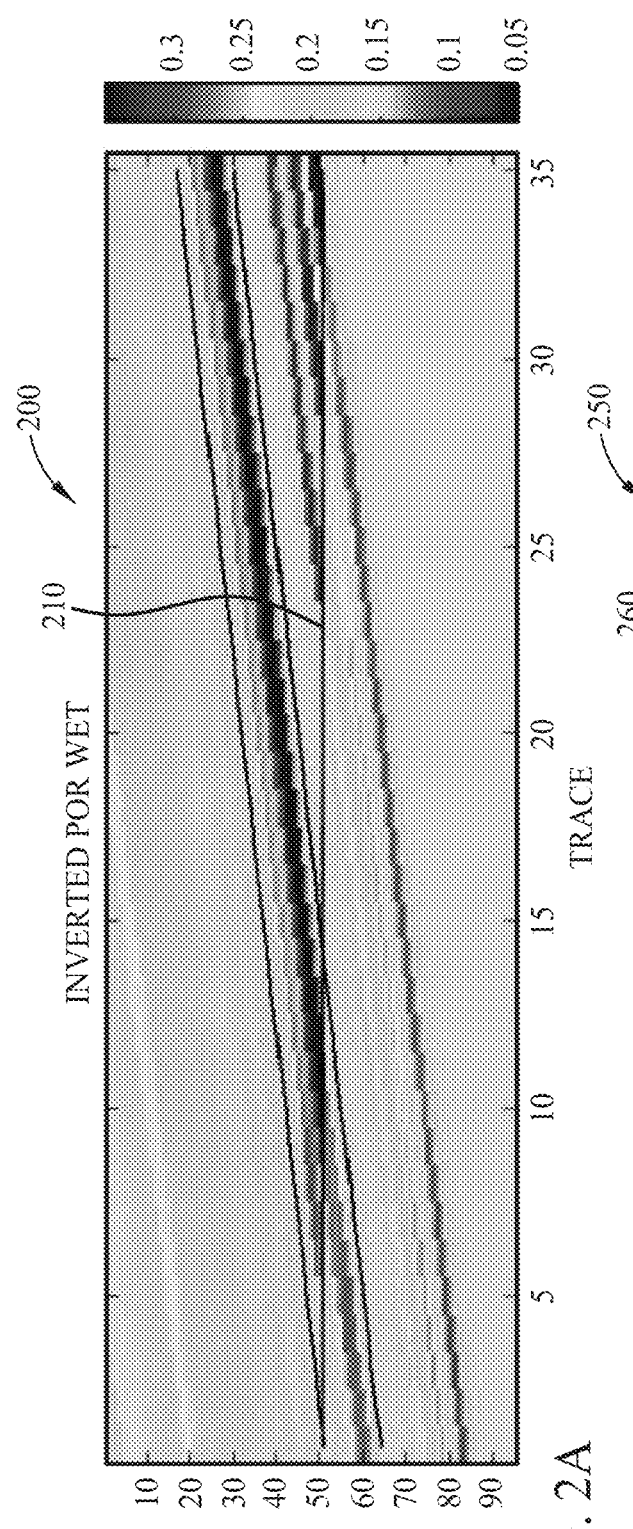
FIG. 2A illustrates two-dimensional porosity results from a trial petrophysical inversion of a water-flood model.
Figure 2B:
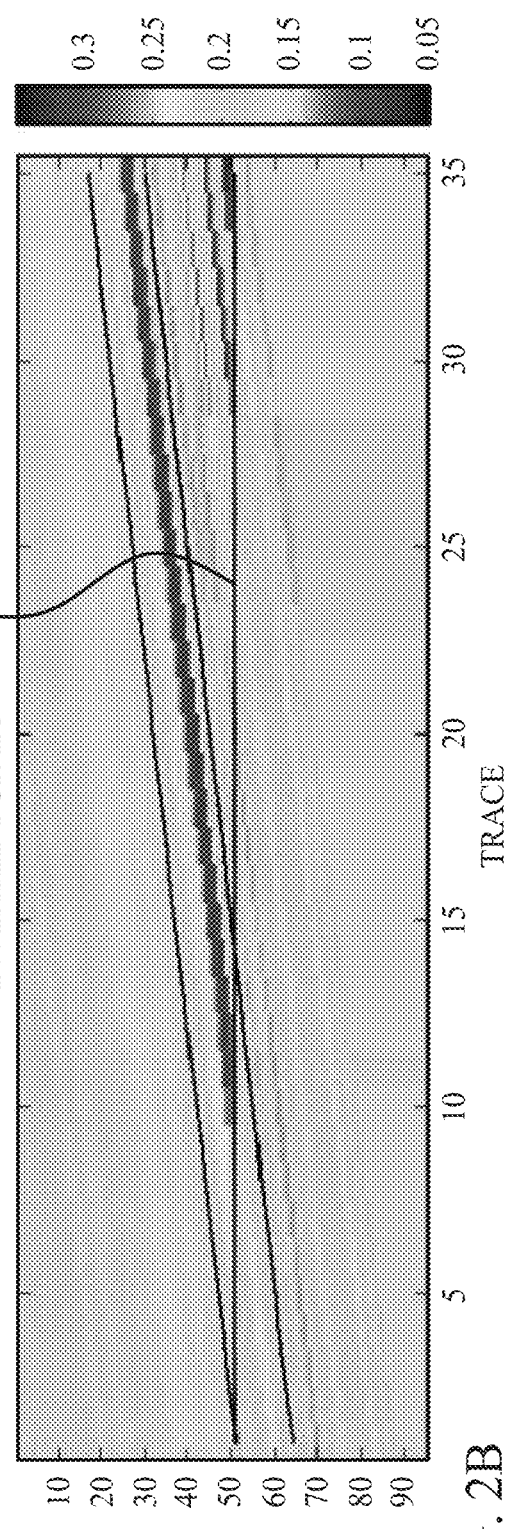
FIG. 2B illustrates two-dimensional porosity results from a trial petrophysical inversion of an oil-flood model.
Figure 3A:
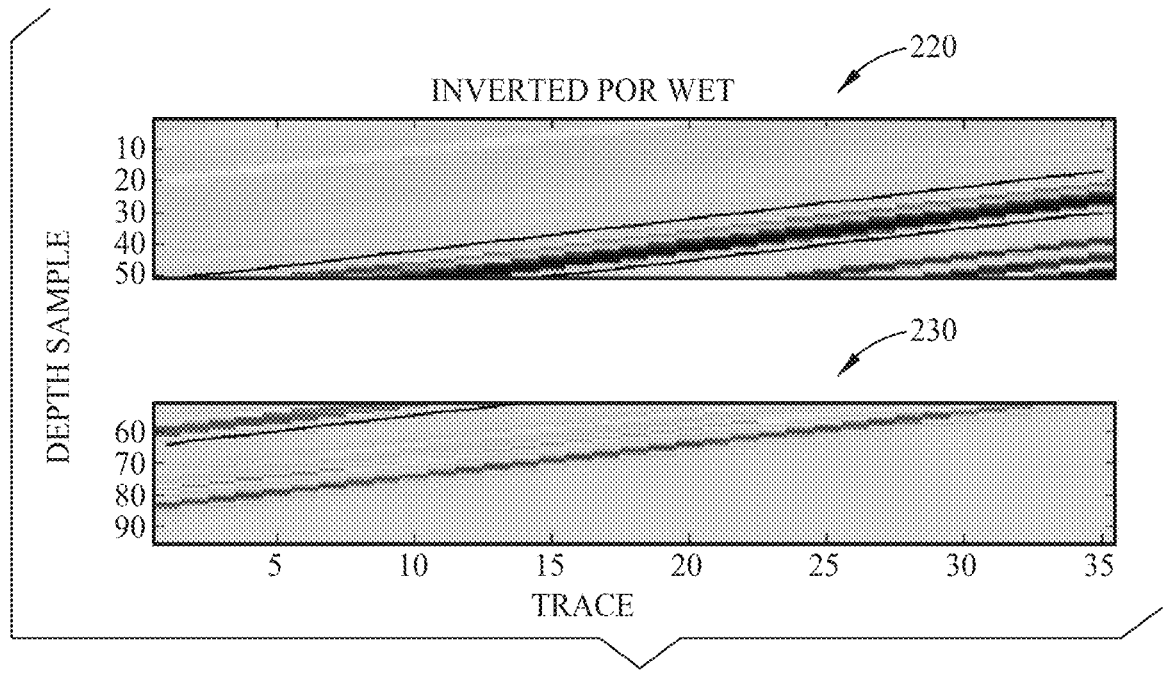
FIG. 3A illustrates partitioning of the water-flood model of FIG. 2A.
Figure 3B:
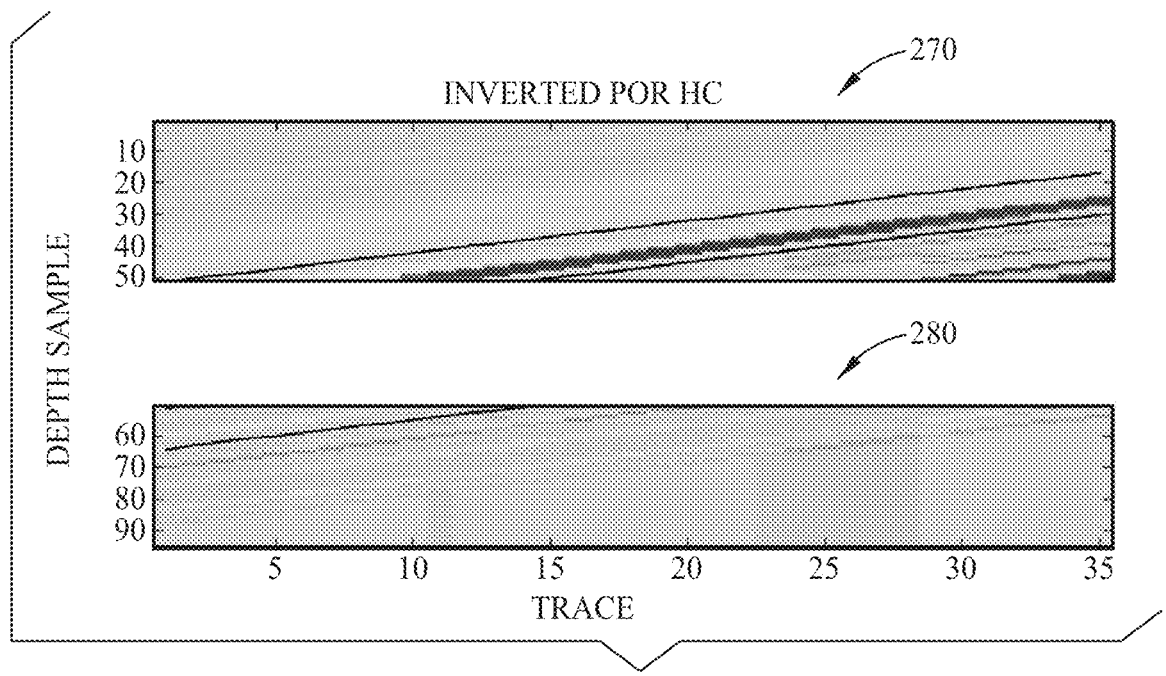
FIG. 3B illustrates partitioning of the oil-flood model of FIG. 2B.
Figure 4:
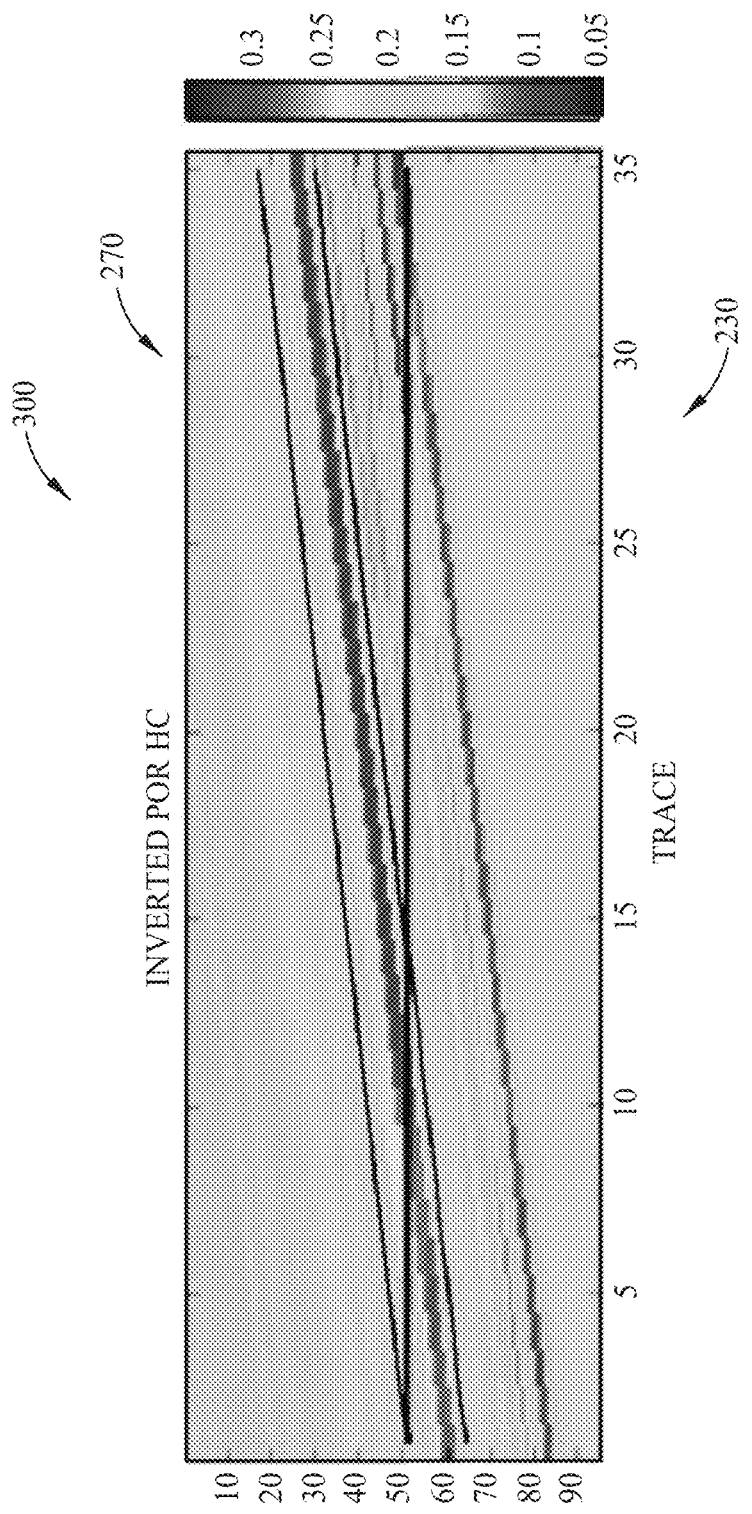
FIG. 4 illustrates a fluid saturation model constructed from a partition (as in FIG. 3A) of a water-flood model and a partition (as in FIG. 3B) of an oil-flood model.

FIG. 1 illustrates an exemplary workflow 100 for constructing a fluid saturation model for petrophysical inversion. Workflow 100 begins at block 110, wherein an initial subsurface region model is obtained. For example, a subsurface region model may be made up of cells identified at locations in the subsurface region. Each cell in the subsurface region model may contain a representation of pore space, for example percentage of pore space. The pore space may determine the amount of fluid that may occupy the pore and/or cell. Each cell in the subsurface region model may contain a representation of volume of clay, for example percentage of volume of clay. The volume of clay may determine the amount of bound-water, and thus decrease the amount of additional fluid that may occupy the pore and/or cell. Seismic data may be utilized to identify possible reflectors, layers, and/or geology of the subsurface formation of interest. The workflow 100 continues at block 120, wherein the subsurface region model is numerically "flooded" with each of the possible fluid types to create a flooded volume. For example, the subsurface region model is utilized to create a water-flood model, an oil-flood model, and a gas-flood model. Each of the flood models is deemed to be fully saturated with the respective fluid type. The workflow 100 continues at block 130, wherein trial petrophysical inversion is run on each of the flood models to compute trial petrophysical models. For example, trial porosity may be computed for each of the water-flood model, the oil-flood model, and the gas-flood model. FIG. 2A illustrates two-dimensional porosity results from a trial petrophysical inversion of a water-flood model 200, while FIG. 2B illustrates two-dimensional porosity results from a trial petrophysical inversion of an oil-flood model 250. In some embodiments, the trial petrophysical models may be one-, two-, or three-dimensional. The workflow 100 continues at block 140 wherein each of the trial petrophysical models is searched to identify potential fluid contact regions. As previously discussed, fluid contact regions are expected to be relatively narrow in the vertical direction and relatively flat in the horizontal direction. Rock property data, such as porosity, is expected to minimally transition and/or remain constant when the fluid type is correctly assumed in the inversion. Therefore, potential fluid contact regions may be identified as relatively horizontal structures of discontinuity in rock properties from the trial petrophysical inversions. In some embodiments, horizontal structures of discontinuity include abrupt, lateral changes in modeled petrophysical properties where there would not otherwise be a basis for change in actual petrophysical properties. In some embodiments, horizontal structures of discontinuity will be observed at the same location on two or more petrophysical models at nearly the same location. In such instances, such horizontal structures of discontinuity may be identified as a potential fluid contact region. Line 210 in FIG. 2A illustrates a relatively horizontal region of discontinuity of porosity in the water-flood model 200. Line 260 in FIG. 2B illustrates a relatively horizontal region of discontinuity of porosity in the oil-flood model 250. Moreover, the depth of line 210 in FIG. 2A is relatively close to the depth of line 260 in FIG. 2B. The workflow 100 continues at block 150 wherein the flood models are partitioned at the potential fluid contact regions. FIG. 3A illustrates partitioning of the water-flood model 200, resulting in higher partition 220 and lower partition 230. FIG. 3B illustrates partitioning of the oil-flood model 250, resulting in higher partition 270 and lower partition 280. The workflow 100 concludes with construction of a fluid saturation model at block 160. For example, fluid saturation model 300 in FIG. 4 is constructed from lower partition 230 from water-flood model 200 and higher partition 270 from oil-flood model 250. The partitions are fit together with a goal of continuity of depth, rock properties, dip angle of known structures, etc.

In the illustrated example, synthetic data has been utilized to demonstrate the principles with simple stratigraphy. A person of ordinary skill in the art with the benefit of this disclosure will recognize the workflow 100 can be applied to more complex stratigraphy to achieve advantageous results. For example, the workflow 100 may identify at block 140 regions that are separated laterally, but which demonstrate similar petrophysical discontinuity at similar depth.

In some embodiments, block 140 may identify potential fluid contact regions based on comparison of aspects of the various flood models. As an example, a possible OWC region can be identified when the oil-flood model porosity is equal to (or substantially similar to) the adjacent and down-dip water-flood porosity model. Likewise, a possible GOC region can be identified when the gas-flood model porosity is equal to (or substantially similar to) the adjacent and down-dip oil-flood porosity model. Additional techniques to identify potential fluid contact regions may include, for example, taking the difference of windowed averages, and/or searching for difference values near zero.

In some embodiments, identifying potential fluid contact regions at block 140 may include producing images of the results of the trial petrophysical inversions from block 130 and visually inspecting the images. In some embodiments, the results (images and/or data) of the trial petrophysical inversions from block 130 may be inspected and/or analyzed with an automated or semi-automated inspection system. In some embodiments, the inspection system may utilize machine learning to improve inspection results over time.

In some embodiments, the initial subsurface region model obtained in block 110 may include a mapped horizon within the cap rock of a known reservoir. In some embodiments, the initial subsurface region model obtained in block 110 may include a flat horizon.

In some embodiments, flooding the subsurface region model in block 120 includes filling available pore space with fluids of gas, oil, and water below the mapped or flat horizon. The process of flooding the model with pore fluids in petrophysical inversion may be somewhat analogous to the concept of velocity flooding used in Pre-SDM. The simplification of the saturation model through flooding allows trial petrophysical inversions to be accurately and efficiently completed in block 130. The trial petrophysical models will be correct at locations where the appropriate fluid flooded the available pore space, and incorrect at locations where the wrong fluid was assumed in the pore space. Within the plurality of trial inversions, at least one correct fluid will be present in one trial inversion at every location.

In some embodiments, the petrophysical property computed in the trial petrophysical inversion of block 130 may be $V_{clay}$. In some embodiments, the petrophysical property computed in the trial petrophysical inversion of block 130 may be porosity. In some embodiments, such as non-brine cases, $S_w$ may be a function of $V_{clay}$, and $S_w$ may evolve as iterations progress to convergence.

In some embodiments, identifying potential fluid contact regions at block 140 may include identifying depth intervals where predicted petrophysical properties for the plurality of flood models are nearly equal in amplitude. In some embodiments, identifying potential fluid contact regions at block 140 may include interpretation of hydrocarbon contacts as substantially flat depth surfaces where continuity of petrophysical properties occurs in reservoir intervals above and below the hypothesized contact. In some embodiments, identifying potential fluid contact regions at block 140 may include searching the trial petrophysical models for locations where one or more of the petrophysical parameters remain locally constant between the trial petrophysical models over a short distance in accordance with principles of gravity segregation of the fluids and with a reasonable expectation of local reservoir quality continuity. In some embodiments, a plurality of methods may be employed to identify potential fluid contact regions.

In some embodiments, partitioning the subsurface region model at potential fluid contact regions at block 150 includes building closed solid models of reservoir units from interpreted hydrocarbon contacts and mapped horizons of associated reservoir units. It should be appreciated that partitioning the subsurface region model at potential fluid contact regions at block 150 may provide a number of benefits over conventional reservoir modeling. For example, based on this analysis of data-driven petrophysical observations, information may be added to the overall reservoir evaluation about time-to-depth conversion, stratigraphic and/or structural compartmentalization, etc., that might otherwise be missed if single-depth related hydrocarbon contacts are assumed.

In some embodiments, the fluid saturation model constructed at block 160 may be utilized to perform a final petrophysical inversion. For example, the fluid saturation model constructed at block 160 may provide a geometry for a closed solid saturation model. The final petrophysical inversion using the most (or one of the more) accurate fluid saturation model of the subsurface region may be utilized to build a geological model for reservoir engineering, and/or as a quality-control step, for example identifying areas of discontinuity within the model. According to yet further embodiments, a petrophysical inversion may be run on a fluid saturation model constructed according to various techniques described herein. Methods according to such embodiments may further comprise managing hydrocarbons based on the petrophysical inversion of the fluid saturation model (e.g., by identification of potential hydrocarbon-bearing formations in the subsurface region based on the petrophysical inversion of the fluid saturation model).

Figure 5:
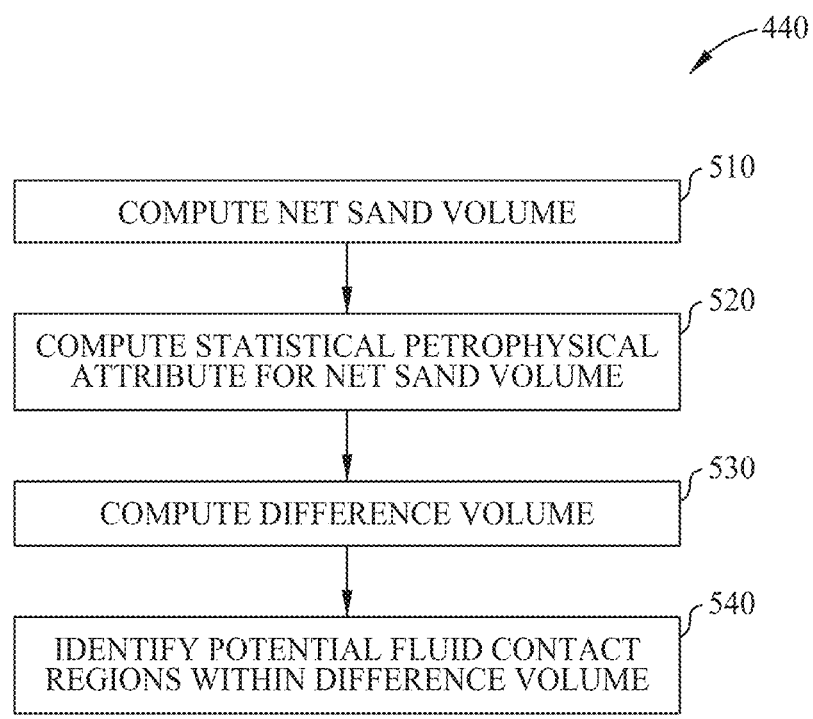
FIG. 5 illustrates an exemplary sub-workflow for identifying potential fluid contact regions.

More specifically, identifying potential fluid contact regions at block 140 may include a sub-workflow 440, as illustrated in FIG. 5. As input to sub-workflow 440, it is assumed that the trial petrophysical inversions run at block 130 resulted in two petrophysical volumes: W as the result of a trial petrophysical inversion of a water-flood model, and O as the result of a trial petrophysical inversion of an oil-flood model. A function that predicts $S_w$ as a function of $V_{clay}$ may be used in the trial petrophysical version of an oil (or gas) flood model (as previously noted, $V_{clay}$ may determine a fraction of pore space that is unavailable to oil or gas due to water saturation within pores among the volume of clay). Sub-workflow 440 begins at step 510 wherein a net sand volume S is computed based on petrophysical volume W and petrophysical volume O. For example, net sand volume S may be computed by thresholding porosity and clay content. As another example, net sand volume S may be computed by subtracting volumes W and O to highlight regions with differences due to fluid type (e.g. sands). A person of ordinary skill in the art with the benefit of this disclosure would understand that the net sand volume S is represented by an array of cells or values indicative of net sand at various locations within the volume. The sub-workflow 440 continues at block 520 wherein a statistical (e.g., average) petrophysical attribute is computed for each cell in the net sand volume S. For example, for each cell of the net sand volume S, dip and/or azimuth information (e.g., from seismic data) may be utilized to select a small subvolume around the cell. Within each subvolume, a statistical petrophysical attribute (e.g. average porosity) may be computed. When utilizing petrophysical volume O, the statistical petrophysical attribute may be computed above the depth of the cell, resulting in volume AO. When utilizing petrophysical volume W, the statistical petrophysical attribute may be computed below the depth of the cell, resulting in volume AW. The sub-workflow 440 continues at block 530, wherein a difference volume D is computed. For example, for each cell of the net sand volume S, dip and/or azimuth information may be utilized to select a small subvolume around the selected cell. In some embodiments, the selected subvolumes for each cell are the same as those selected in block 520. Within each subvolume, a statistical measure (e.g., an average, median, or P90) is computed using volumes AO and AW. For example, points may be selected up dip and down dip of the cell to compute the statistical measure, and volume AO may be used up dip, while volume AW is used down dip. The difference between the statistical measures for subvolumes selected from volumes AO and AW may result in a difference volume D. The sub-workflow 440 completes at block 540, wherein potential fluid contact regions are identified. For example, minima in difference volume D are potential locations for fluid contact regions because of the continuity of the sand properties of the petrophysical volume O above the depth of the potential fluid contact region and of the petrophysical volume W below the depth of the potential fluid contact region. In some embodiments, the relative strength of the signal in difference volume D (e.g., minima much lower than other values) may be utilized as a predictor of certainty in the identification of the potential fluid contact region.

Figure 6:
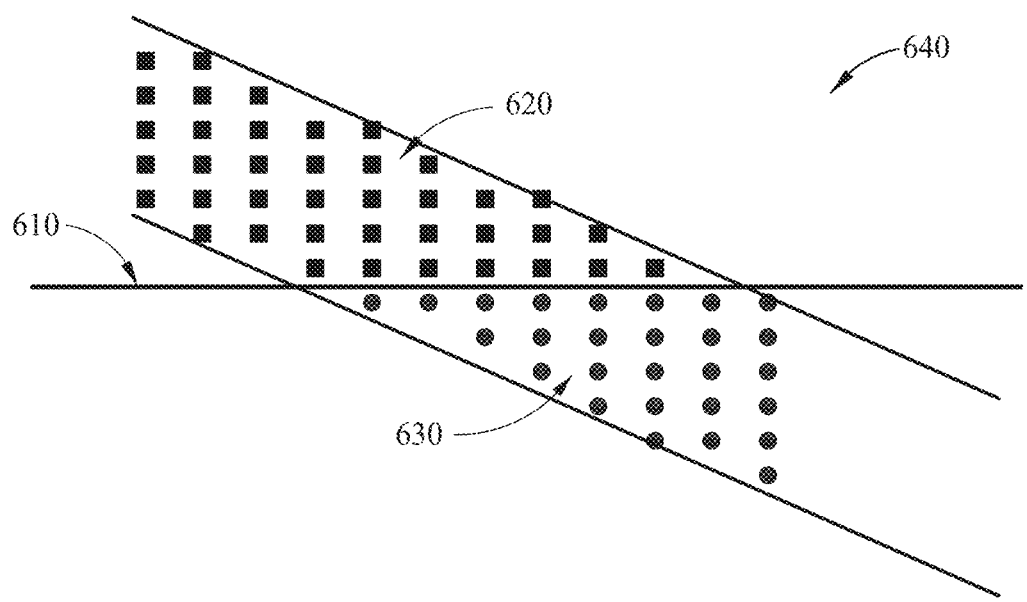
FIG. 6 illustrates a representation of a subsurface region useful for identifying potential fluid contact regions.

FIG. 6 illustrates an exemplary representation of subsurface region 640 useful for identifying potential fluid contact regions, as at block 140 (in FIG. 1). As illustrated, porosity and $V_{clay}$ results from the petrophysical inversions of the oil-flood model and the water-flood model (from block 130 in FIG. 1) are depth-converted aggregations. Two volumes, $X_{hydrocarbon}$ and $X_{brine}$, are computed using any combination of porosity and $V_{clay}$ (e.g. porosity, $V_{clay}$, porosity-$V_{clay}$, etc.) which enhances or maximizes the difference between the water-flood and the oil-flood inversions. For each cell (illustrated as squares and circles) in the two volumes, a subvolume is selected that extends above that cell and includes that cell. The average value of $X_{hydrocarbon}$ is computed within the subvolume, resulting in an average hydrocarbon (HC) volume 620. Similarly, for each cell, a subvolume is selected that extends below that cell and includes that cell. The average value of $X_{brine}$ is computed within the subvolume, resulting in an average Brine volume 630. The minima of the absolute difference between each cell in average HC volume 620 and average Brine volume 630 are indicative of a potential fluid contact region 610.

Figure 7:
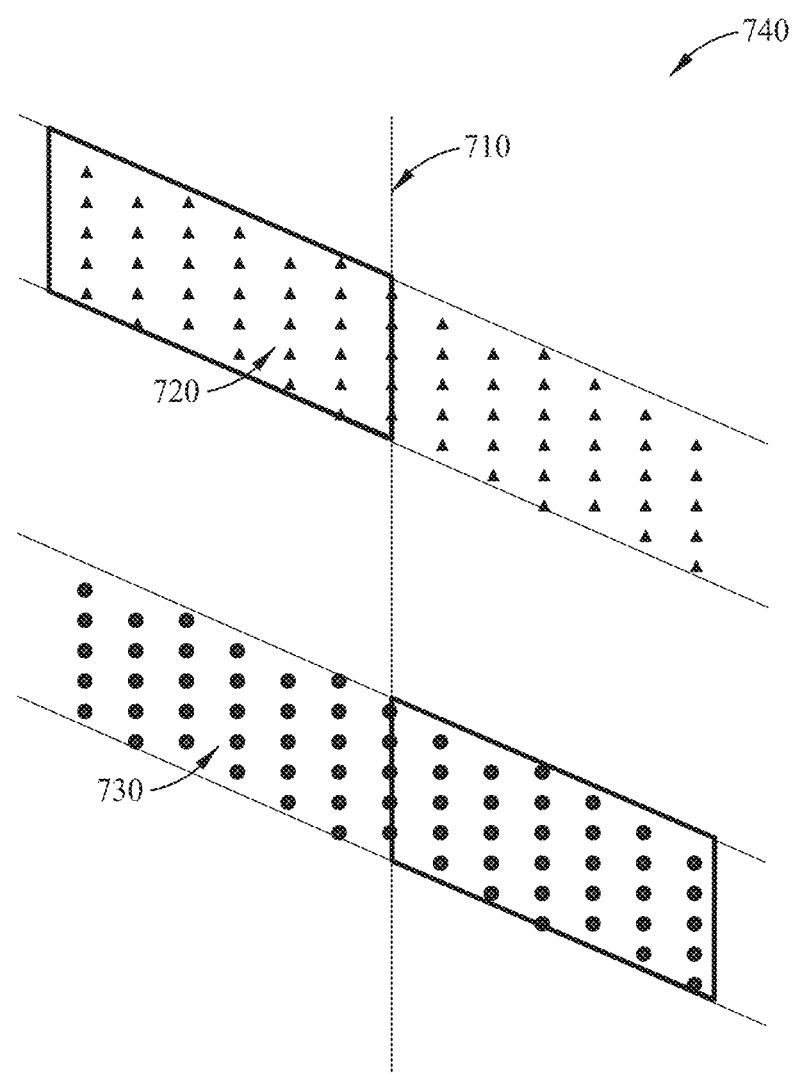
FIG. 7 illustrates another representation of a subsurface region useful for identifying potential fluid contact regions.

FIG. 7 illustrates another exemplary representation of a subsurface region 740 useful for identifying potential fluid contact regions, as at block 140 (in FIG. 1). As before, an average HC volume 720 and an average Brine volume 730 are computed. For each cell (illustrated as triangles) in average HC volume 720, a subvolume updip of the cell is selected, and an average property for the subvolume is computed, resulting in a lateral average HC volume. Similarly, for each cell (illustrated as circles) in average Brine volume 730, a subvolume downdip of the cell is selected, and an average property for the subvolume is computed, resulting in a lateral average Brine volume. An absolute lateral difference is computed by subtracting the lateral average HC volume from the lateral average Brine volume. The minima of the absolute difference are indicative of a potential fluid contact region 710.

In practical applications, several of the embodiments described herein must be used in conjunction with, and/or carried out using, a seismic data analysis system (e.g., a high-speed computer) programmed in accordance with the disclosures herein. For example, any of the petrophysical or other inversion techniques will in various of these embodiments be carried out using such a system. Likewise, generating the various models (e.g., models of the subsurface region; flood models; and/or fluid saturation models) will be carried out using such as system, according to various of these embodiments. Identification of misfits may also be carried out using such a system (e.g., automated or semi-automated identification), although it will be appreciated that such identification may be carried out in whole or in part by user input. Such a seismic data analysis system may be referred to in generic shorthand simply as a "computer." The same or a different computer (and/or seismic data analysis system) may be used to carry out different inversions, and/or different steps of generating a model and/or displaying an image of a subsurface region.

Preferably, in order to effectively perform petrophysical inversion according to various embodiments herein, the seismic data analysis system is a high performance computer (HPC), as known to those skilled in the art. Such high performance computers typically involve clusters of nodes, each node having multiple central processing units (CPUs) and computer memory that allow parallel computation. The models may be visualized and edited using any interactive visualization programs and associated hardware, such as monitors and projectors. The architecture of the system may vary and may be composed of any number of suitable hardware structures capable of executing logical operations and displaying the output according to the present technological advancement. Those of ordinary skill in the art are aware of suitable supercomputers available from Cray or IBM.

As will be appreciated from the above discussion, in certain embodiments of the present approach, expert inputs are elicited that will have the most impact on the efficacy of a learning algorithm employed in the analysis, such as a classification or ranking algorithm, and which may involve eliciting a judgment or evaluation of classification or rank (e.g., right or wrong, good or bad) by the reviewer with respect to a presented query. Such inputs may be incorporated in real time in the analysis of seismic data, either in a distributed or non-distributed computing framework. In certain implementations, queries to elicit such input are generated based on a seismic data set undergoing automated evaluation, and the queries are sent to a workstation for an expert to review.

Figure 8:
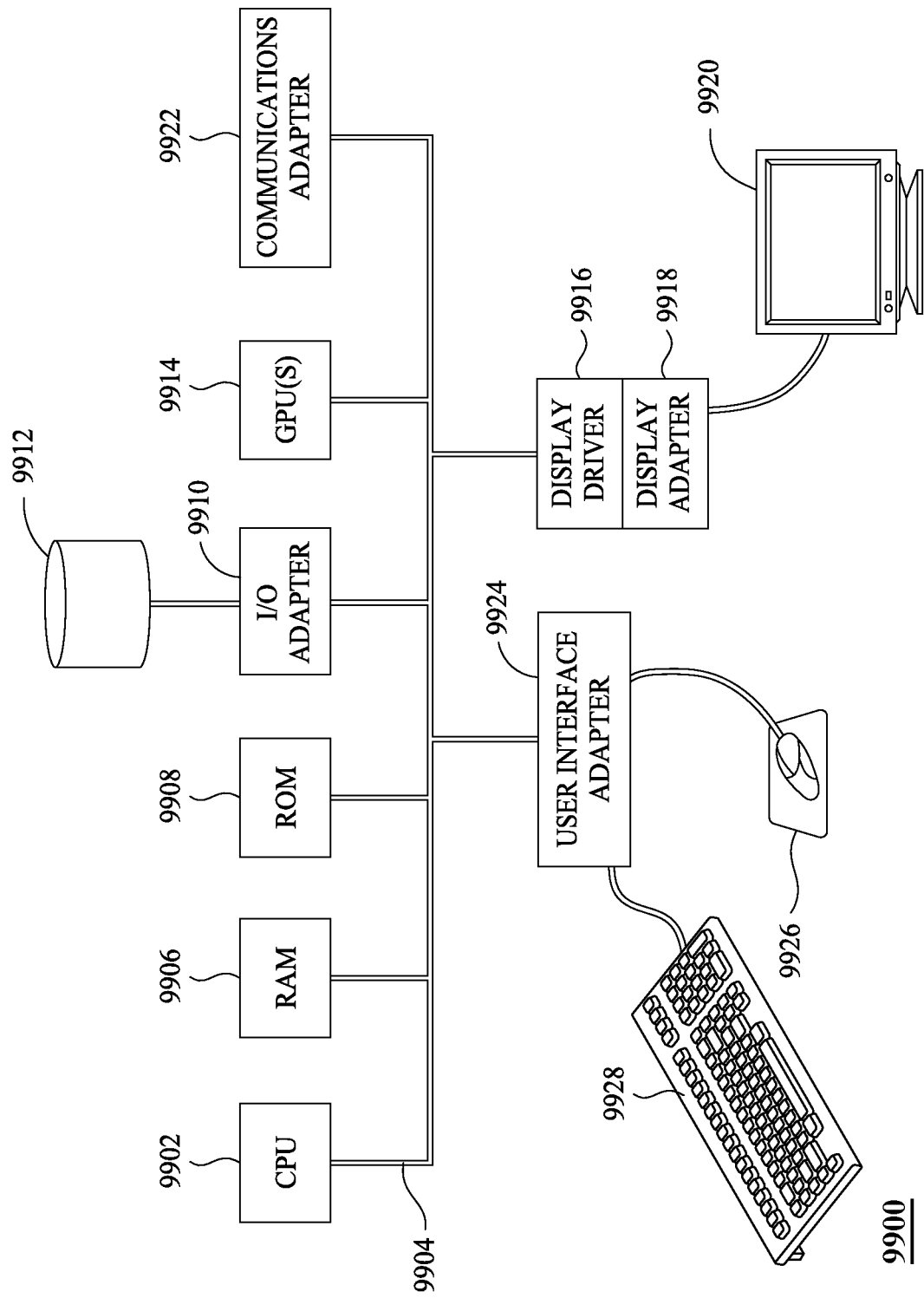
FIG. 8 illustrates a block diagram of a geophysical data analysis system upon which the present technological advancement may be embodied.

FIG. 8 illustrates a block diagram of a geophysical data analysis system 9900 upon which the present technological advancement may be embodied. A central processing unit (CPU) 9902 is coupled to system bus 9904. The CPU 9902 may be any general-purpose CPU, although other types of architectures of CPU 9902 (or other components of exemplary system 9900) may be used as long as CPU 9902 (and other components of system 9900) supports the operations as described herein. Those of ordinary skill in the art will appreciate that, while only a single CPU 9902 is shown in FIG. 8, additional CPUs may be present. Moreover, the system 9900 may comprise a networked, multi-processor computer system that may include a hybrid parallel CPU/GPU system. The CPU 9902 may execute the various logical instructions according to various teachings disclosed herein. For example, the CPU 9902 may execute machine-level instructions for performing processing according to the operational flow described.

The geophysical data analysis system 9900 may also include computer components such as non-transitory, computer-readable media. Examples of computer-readable media include a random access memory ("RAM") 9906, which may be SRAM, DRAM, SDRAM, or the like. The system 9900 may also include additional non-transitory, computer-readable media such as a read-only memory ("ROM") 9908, which may be PROM, EPROM, EEPROM, or the like. RAM 9906 and ROM 9908 hold user and system data and programs, as is known in the art. The system 9900 may also include an input/output (I/O) adapter 9910, a communications adapter 9922, a user interface adapter 9924, and a display adapter 9918; it may potentially also include one or more graphics processor units (GPUs) 9914, and one or more display driver(s) 9916.

The I/O adapter 9910 may connect additional non-transitory, computer-readable media such as a storage device(s) 9912, including, for example, a hard drive, a compact disc ("CD") drive, a floppy disk drive, a tape drive, and the like to geophysical data analysis system 9900. The storage device(s) may be used when RAM 9906 is insufficient for the memory requirements associated with storing data for operations of the present techniques. The data storage of the system 9900 may be used for storing information and/or other data used or generated as disclosed herein. For example, storage device(s) 9912 may be used to store configuration information or additional plug-ins in accordance with the present techniques. Further, user interface adapter 9924 couples user input devices, such as a keyboard 9928, a pointing device 9926 and/or output devices to the system 9900. The display adapter 9918 is driven by the CPU 9902 to control the display on a display device 9920 to, for example, present information to the user. For instance, the display device may be configured to display visual or graphical representations of any or all of the models discussed herein (e.g., the fluid saturation models and/or the models of the subsurface region). As the models themselves are representations of geophysical data, such a display device may also be said more generically to be configured to display graphical representations of a geophysical data set, which geophysical data set may include the models (e.g., subsurface region models, fluid saturation models) described herein, as well as any other geophysical data set those skilled in the art will recognize and appreciate with the benefit of this disclosure.

The architecture of geophysical data analysis system 9900 may be varied as desired. For example, any suitable processor-based device may be used, including without limitation personal computers, laptop computers, computer workstations, and multi-processor servers. Moreover, the present technological advancement may be implemented on application specific integrated circuits ("ASICs") or very large scale integrated ("VLSI") circuits. In fact, persons of ordinary skill in the art may use any number of suitable hardware structures capable of executing logical operations according to the present technological advancement. The term "processing circuit" encompasses a hardware processor (such as those found in the hardware devices noted above), ASICs, and VLSI circuits. Input data to the system 9900 may include various plug-ins and library files. Input data may additionally include configuration information.

The above-described techniques, and/or systems implementing such techniques, can further include hydrocarbon management based at least in part upon the above techniques. For instance, methods according to various embodiments may include managing hydrocarbons based at least in part upon a fluid saturation model constructed according to the above-described methods. In particular, such methods may include drilling a well, and/or causing a well to be drilled, based at least in part upon the constructed fluid saturation model (e.g., such that the well is located based at least in part upon a location determined from the fluid saturation model, which location may optionally be informed by other inputs, data, and/or analyses, as well) and further prospecting for and/or producing hydrocarbons using the well.

The foregoing description is directed to particular example embodiments of the present technological advancement. It will be apparent, however, to one skilled in the art, that many modifications and variations to the embodiments described herein are possible. All such modifications and variations are intended to be within the scope of the present disclosure, as defined in the appended claims. Persons skilled in the art will readily recognize that in preferred embodiments of the invention, some or all of the steps in the present inventive method are performed using a computer, i.e., the invention is computer implemented. In such cases, the fluid saturation models (and/or images generated of the model, or of a subsurface region model) may be downloaded or saved to computer storage, and/or displayed using a computer and/or associated display.

What is claimed is:

1. A method for generating a fluid saturation model for a subsurface region comprising:
    obtaining a model of the subsurface region;
    for each of a plurality of fluid types:
        flooding the subsurface region model with the fluid type to generate a flood model; and
        running a trial petrophysical inversion with the flood model to generate a trial petrophysical model;
    identifying one or more potential fluid contact regions in at least two of the trial petrophysical models;
    partitioning each of the at least two trial petrophysical models at the one or more identified potential fluid contact regions;
    constructing the fluid saturation model from the at least two partitioned trial petrophysical models by comparing data from the at least two trial petrophysical models and, based on the comparing, including at least one partition from each of the at least two trial petrophysical models in the fluid saturation model;
    running a petrophysical inversion of the fluid saturation model; and
    identifying potential hydrocarbon-bearing formations in the subsurface region based on the petrophysical inversion of the fluid saturation model.

2. The method of claim 1, wherein the plurality of fluid types comprise water, oil, and gas.

3. The method of claim 1, wherein each trial petrophysical model comprises values for at least one of porosity and volume of clay.

4. The method of claim 1, wherein the flood model for a non-water fluid type uses a function that predicts water saturation as a function of volume of clay.

5. The method of claim 1, wherein identifying the one or more potential fluid contact regions comprises searching the trial petrophysical models for locations wherein one or more petrophysical parameters remain locally constant between at least two of the trial petrophysical models over a short distance.

6. The method of claim 5, wherein the one or more petrophysical parameters comprise at least one of porosity and volume of clay.

7. The method of claim 1, wherein identifying the one or more potential fluid contact regions in the trial petrophysical models comprises inspecting the trial petrophysical models to identify horizontal structures of discontinuity.

8. The method of claim 7, wherein the inspecting comprises a visual inspection of images of the trial petrophysical models.

9. The method of claim 1, wherein the trial petrophysical inversion comprises at least one of: a two-stage petrophysical inversion, a one-stage petrophysical inversion, a petrophysically-constrained Full Wavefield Inversion, and a joint inversion.

10. The method of claim 1, wherein identifying the one or more potential fluid contact regions in the trial petrophysical models comprises:
    computing a net sand volume;
    for each of a plurality of cells in the net sand volume, computing a statistical petrophysical attribute;
    computing a difference volume from the statistical petrophysical attributes of the plurality of cells; and
    identifying the potential fluid contact regions within the difference volume.

11. The method of claim 10, wherein, for each of the plurality of cells in the net sand volume, the statistical petrophysical attribute is computed for a small subvolume around the cell.

12. The method of claim 11, wherein the statistical petrophysical attribute is an average of a corresponding petrophysical attribute in the small subvolume around the cell.

13. The method of claim 11, wherein, for an oil-flood model, for each of the plurality of cells in the net sand volume, the small subvolume includes at least one value above the cell.

14. The method of claim 10, wherein identifying the one or more potential fluid contact regions comprises identifying minima in the difference volume.

15. The method of claim 1, further comprising identifying potential hydrocarbon-bearing formations in the subsurface region based at least in part on the constructed fluid saturation model.

16. The method of claim 1, further comprising managing hydrocarbons based at least in part upon the constructed fluid saturation model.

17. The method of claim 16, wherein managing hydrocarbons comprises causing a well to be drilled to prospect for hydrocarbons.

18. The method of claim 1, wherein flooding the subsurface region model and running a trial petrophysical inversion are each carried out using a geophysical data analysis system.

19. The method of claim 1, wherein identifying one or more potential fluid contact regions in the trial petrophysical models, partitioning the subsurface region model, and constructing the fluid saturation model are each carried out using a geophysical data analysis system.

20. The method of claim 19, wherein the geophysical data analysis system comprises:
    a processor; and
    a display device configured to display graphical representations of the model of the subsurface region and/or the fluid saturation model.

* * * * *